United States Patent [19]

Kawata et al.

[11] Patent Number: 4,642,879
[45] Date of Patent: Feb. 17, 1987

[54] METHOD OF MAKING SELF-ALIGNED FET USING GAAS SUBSTRATE AND SPATIALLY CONTROLLED IMPLANTED CHANNEL REGION

[75] Inventors: Haruo Kawata, Atsugi; Hidetoshi Nishi, Yamato, both of Japan

[73] Assignee: Fujitsu Limited, Kawasaki, Japan

[21] Appl. No.: 555,547

[22] Filed: Nov. 28, 1983

[30] Foreign Application Priority Data

Nov. 29, 1982 [JP] Japan .................................. 57-209078

[51] Int. Cl.[4] .................. H01L 21/263; H01L 21/324
[52] U.S. Cl. ..................................... 29/576 B; 29/571; 148/1.5; 148/187; 148/DIG. 84; 148/DIG. 140; 357/23.2; 357/91
[58] Field of Search ............... 29/576 B, 571; 148/1.5, 148/187; 357/23.2, 91

[56] References Cited

U.S. PATENT DOCUMENTS

| | | | |
|---|---|---|---|
| 4,396,437 | 8/1983 | Kwok et al. | 148/1.5 |
| 4,426,765 | 1/1984 | Shahriary et al. | 29/571 |
| 4,426,767 | 1/1984 | Swanson et al. | 29/571 |
| 4,452,646 | 6/1984 | Zuleeg | 148/1.5 |
| 4,505,023 | 3/1985 | Tseng et al. | 29/571 |
| 4,519,127 | 5/1985 | Arai | 29/571 |
| 4,532,695 | 8/1985 | Schuermeyer | 29/571 |

OTHER PUBLICATIONS

Onodera et al, Electronics Letts., 20 (Jan. 1984) 45.
Andrade IBM-TDB, 25 (Oct. 1982) 2373.
Kung et al, Electronics Letts., 13 (1977) 187–188.
Okamura et al, Appl. Phys. Letts., 40 (1982) 689.
Codella et al, IBM-TDB, 26 (1983) 1988.

*Primary Examiner*—Upendra Roy
*Attorney, Agent, or Firm*—Staas & Halsey

[57] ABSTRACT

High transconductance is obtained in GaAs FET's by forming a channel layer having a carrier concentration monotonously decreasing from the interface of the channel layer and a control gate toward the interface of the channel layer and the substrate it is formed in. This is established by ion implantation of the channel layer through an insulating layer, preferably an AlN layer, on a GaAs substrate. An AlN layer is preferable since it has no adverse effects on the GaAs substrate during ion implantation and the following heat treatment, allowing higher uniformity of the threshold voltages of the FET's.

9 Claims, 9 Drawing Figures

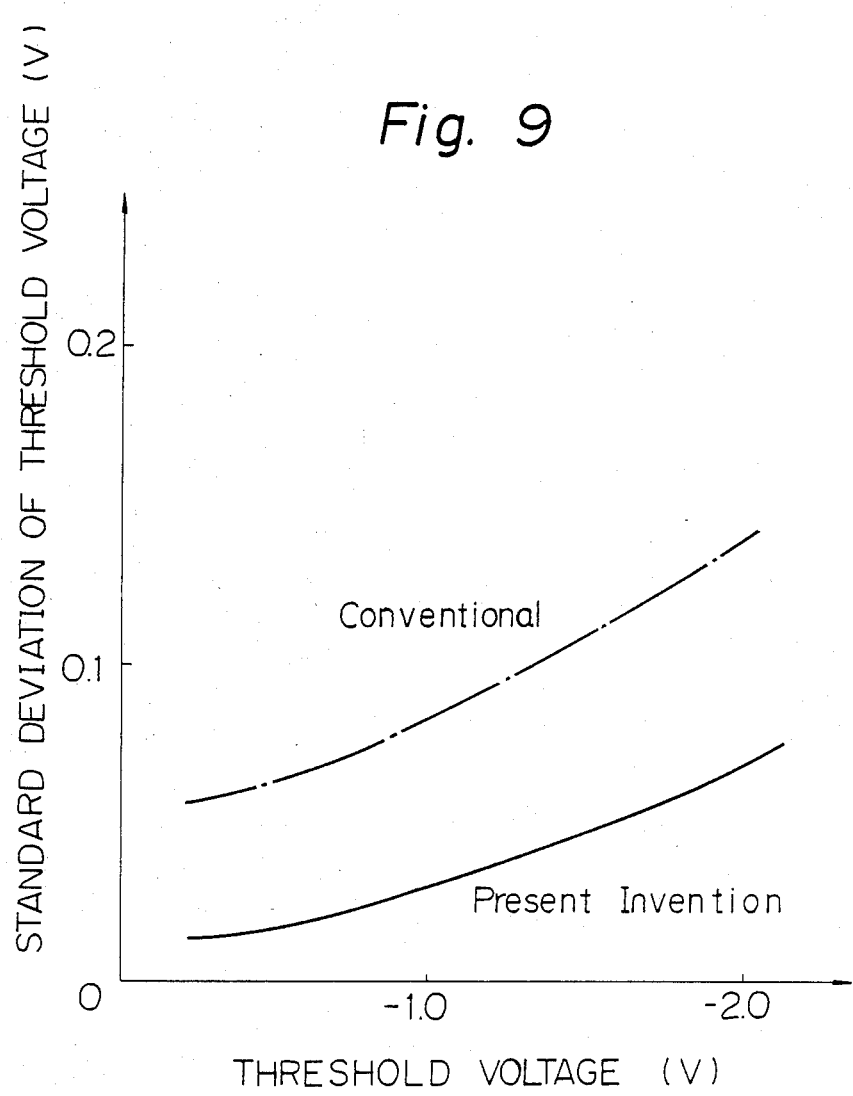

METHOD OF MAKING SELF-ALIGNED FET USING GAAS SUBSTRATE AND SPATIALLY CONTROLLED IMPLANTED CHANNEL REGION

BACKGROUND OF THE INVENTION

1. Field of the Invention

The present invention relates to a field effect transistor (FET) and a process for fabricating the same. More particularly the present invention is directed to a compound semiconductor FET with a high transconductance and a process for fabricating the same.

2. Description of the Prior Art

Gallium arsenide (GaAs) integrated circuits (IC's) are promising as high speed devices for telecommunications and computers as an alternative to silicon (Si) large scale integrated circuits (LSI's) and are, therefore, under vigorous investigation. For example, recently GaAs LSI's; such as a 16×16-bit multiplier and a 1k-bit static random access memory have been successfully fabricated. In order to improve the output-current-drive; capability and the degree of integration of the GaAs LSI's, it is necessary to decrease the size of an element of a GaAs LSI, and to increase the transconductance $g_m$ of a GaAS FET.

The $g_m$ of an FET is expressed by the following formula:

$$g_m = \frac{\epsilon \mu W_g}{dL_g}(V_{gs} - V_{th})$$

wherein $\epsilon$ is the dielectric constant of the GaAS, $\mu$ the carrier mobility, $W_g$ the gate width, d the effective channel layer thickness, $L_g$ the gate length, $V_{gs}$ the voltage applied between the gate and source electrodes, and $V_{th}$ the threshold voltage. The $g_m$ per unit gate width having fixed $V_{th}$ can be increased by shortening $L_g$, increasing $\mu$, or reducing d, in accordance with constant $\epsilon$. The common way to decrease the device size and the gate capacitance is to shorten the gate length. Although most conventional semiconductors are of silicon, compound semiconductors such as GaAs are now under investigation, snce they have a larger $\mu$ than that of silicon. The present invention is directed to reducing of d, i.e., to reducing the effective channel layer thickness.

Recently, the channel layer of an FET of a compound semiconductor LSI, such as a GaAS LSI, is, in general, formed by an ion implantation technique. The depth distribution of the concentration of implanted ions in the channel layer becomes approximately the Gaussian distribution given in the Lindhard, Scharf, and Schiott theory, and the effective channel layer thickness d can be considered to be approximately $$\left( R_p + \sigma \sqrt{\frac{8}{\pi}} \right),$$

wherein $R_p$ is the mean projected range and $\sigma$ the standard deviation of the projected range. When the kinds of the material of the compound semiconductor substrate to be ion-implanted and the ions which should be implanted into the substrate are given, the decrease in the ion implanting energy causes a decrease in both $R_p$ and $\sigma$, reducing the effective channel layer thickness d. The decrease in the ion implanting energy is, however, limited by the capability of the ion implantation apparatus along with increasing the sputtering effects; and causes problems such as a decrease in the controllability and in the uniformity of the ion implantation and a decrease in the carrier mobility.

Further, conventional ion implantation techniques and the subsequent heat treatment for activating the ions produce problems such as dispersion of the threshold voltage. Ion implantation into a bare compound semiconductor substrate may enhance dissociation of the components and oxidation at the surface of the substrate. Ion implantation through an insulating layer into a compound semiconductor substrate causes the incorporation of the element atoms of the insulating layer into the compound semiconductor substrate, which may have an adverse effect on the compound semiconductor. Heat treatment after ion implantation to activate the implanted ions may cause strains in the substrate due to the difference in the heat expansion coefficients of the substrate and surface protective layers. These result in defects and nonuniform carrier distribution of a channel layer formed in the compound semiconductor substrate, causing nonuniform distribution of the threshold voltages of the FET's across a wafer. Decreasing the standard deviation of the threshold voltage is necessary in order to increase the degree of integration of the LSI's.

One of the inventors of the present invention has already proposed the use of an aluminum nitride (AlN) layer as a protective film for both the ion-implantation and the subsequent heat treatment. In the proposed method, the ions are implanted through the aluminum nitride layer. However, the trend is to use a thinner aluminum nitride layer as a protective film for the ion implantation and, therefore, the threshold voltages may vary at different portions of the wafer. The deviation of the threshold voltages of FET's, $\Delta V_{th}$, is an important problem in fabricating GaAS LSI's. At present, when 1k-bit LSI's are fabricated, $\Delta V_{th}$ is allowed up to approximately 60 mV, which can be attained by the prior art though the yield of the LSI's is low. However, when 4k to 64k-bit LSI's are to be fabricated, $\Delta V_{th}$ should be decreased, for example, in the range of approximately 50 to 20 mV, which cannot be attained by the prior art as mentioned above.

SUMMARY OF THE INVENTION

It is therefore an object of the present invention to provide a compound semiconductor FET having an improved transconductance.

Another object of the present invention is to improve the ion implantation and the following heat treatment, to provide a process for fabricating FET's having an improved uniformity of threshold voltages.

These and other objects, features, and advantages of the present invention are accomplished by an FET comprising a source, a drain, and a control gate in and on a compound semiconductor substrate, characterized in that the FET has an ion-implanted channel layer in the compound semiconductor substrate adjacent to the top surface thereof, below the control gate. The concentration of ions in the channel layer has a maximum value at the top surface thereof and monotonously decreasing from the top surface toward the bottom surface of the compound semiconductor substrate.

An FET according to the present invention is fabricated by implanting ions into the compound semiconductor substrate through an insulating layer formed thereon, and by controlling the thickness of the insulating layer and the energy of the ion implantation so that the distribution of the concentration of ions implanted in the substrate has a maximum concentration at the top surface of the substrate, i.e., at the interface of the substrate and the insulating layer. By such a process, an FET can be formed having an excellent channel layer thinner than that obtainable in the conventional process.

In a process of fabricating an FET according to the present invention, it is preferable to use an AlN layer as an insulating layer on a GaAs substrate through which ion implantation of the substrate is performed. This AlN layer can prevent adverse effects during the ion implantation and during the heat treatment of the channel layer, snce the AlN is the same III-V group compound as GaAs; therefore, the recoil implantation is not a serious problem, and the AlN layer has an approximately equal coefficient of linear expansion as that of GaAs which is effective in minimizing the thermal stress from the cap to the crystal. FET's fabricated by using an AlN layer have a small standard deviation of the threshold voltages, improving the throughput of the products, particularly when the degree of integration is increased.

Further, it is preferable to cover the AlN layer used for through-ion-implantation with another insulating layer such as AlN, $SiO_2$, $Si_3N_4$ or $Al_2O_3$, and the like, before performing the heat treatment for activation, when the thickness of the AlN layer for through-ion-implantation becomes thin. This is in order to increase the transconductance of the FET. A too thin AlN layer will lose much of its property as an excellent surface protective layer during the heat treatment for ion activation. It has been found that another insulating layer may, however, be formed of a material other than AlN, such as $SiO_2$ or $Si_3N_4$.

BRIEF DESCRIPTION OF THE DRAWINGS

The present invention is more fully described with reference to the drawings, in which:

FIG. 9 is a graph of the standard deviation of the threshold voltage vs. the threshold voltage.

DESCRIPTION OF THE PREFERRED EMBODIMENTS

FIGS. 1 to 7 illustrate a process for fabricating an FET according to the present invention. In this example, semiconductor devices are fabricated each having 100 GaAs depletion mode Schottky type FET's. Only one such FET is illustrated in the figures.

Figure 1:
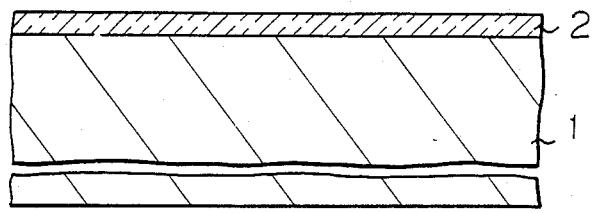
FIGS. 1 to 7 are sectional views of an FET during fabrication.

Referring to FIG. 1, on a semi-insulating GaAs single crystal substrate 1 containing approximately 0.8 wt ppm chromium, a first AlN layer 2 is deposited to a thickness of approximately 55 nm by a reactive sputtering technique. This first AlN layer 2 preferably has a thickness that will not necessitate high energy ion implantation, a high energy ion-implantation will result in a large deviation of the projected range, enlarging the effective channel layer thickness, and, therefore, decreasing the effect of improving the transconductance. The thickness of the first AlN layer 2 is generally in the range below 100 nm, preferably less. In this embodiment it is 55 nm.

Figure 2:
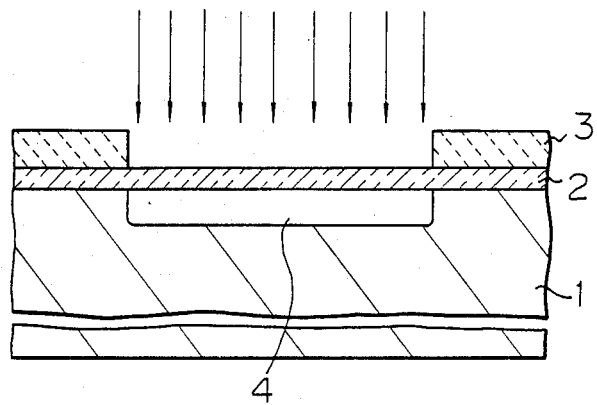

In FIG. 2, a mask 3, e.g., silicon dioxide, 800 nm thick is placed covering the first AlN layer 2 and is selectively etched to open a window where a channel layer 4 is to be formed. Silicon ions are implanted into the channel and layer 4 at an acceleration energy of 59 keV and a dosage of $4 \times 10^{12}$ cm$^{-2}$ by using the mask 3, through the first AlN layer 2. The acceleration energy and dosage were selected to obtain a distribution of ions in the channel layer 4 after heat treatment, with the maximum concentration at the top surface of the substrate 1, i.e., at the interface of the substrate 1 and the first AlN layer 2, when the first AlN layer 2 has a thickness of 55 nm. The acceleration energy and dosage depend on the kind and the thickness of the insulating layer and on the desired threshold voltages.

Figure 3:
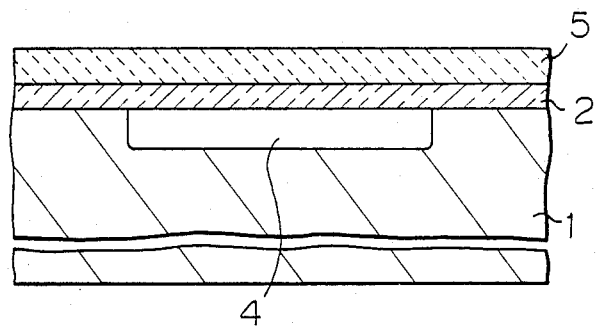

In FIG. 3, the mask 3 is removed and a second AlN layer 5, approximately 80 nm thick, is then deposited onto the first AlN layer 2 by a reactive sputtering technique. The implanted silicon ions are then activated by heat treatment at a temperature of approximately 800° C. for a period of approximately 20 minutes. The characteristics of the thus ion-implanted GaAs substrate and the FET's fabricated therefrom will be described below in more detail.

Conventional processes may be used after the heat treatment, one of which is described below as an example.

Figure 4:
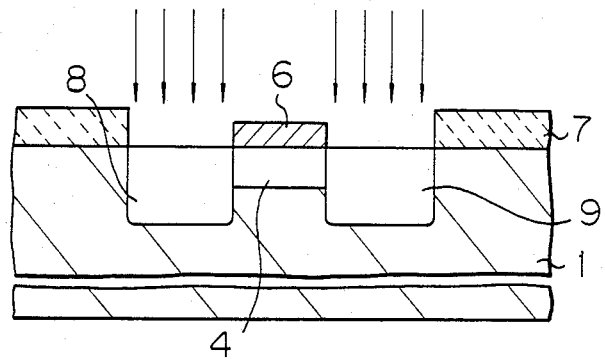

In FIG. 4, the first and second AlN layers 2 and 5 are removed. A metal layer of, e.g., tungsten silicide ($W_5Si_3$), one of the materials that maintains Schottky contact with the GaAs substrate 1 even after a high temperature heat treatment to activate the implanted ions, is deposited over the entire surface to a thickness of approximately 500 nm, and is then patterned to form a control gate 6. A silicon dioxide layer 7, approximately 500 nm thick, is then deposited and patterned to open a window corresponding to the source and drain regions 8 and 9. This silicon dioxide layer 7 is a mask for the following ion implantation and may be replaced by the before-mentioned silicon dioxide mask 3. Ion implantation of the silicon ions is performed at an acceleration voltage of 175 keV and a dosaage of $1.7 \times 10^{13}$ cm$^{-2}$. In this ion implantation, the control gate 6 and the silicon dioxide layer 7 act as masks, and silicon ions are implanted to form a source region 8 and a drain region 9.

Figure 5:
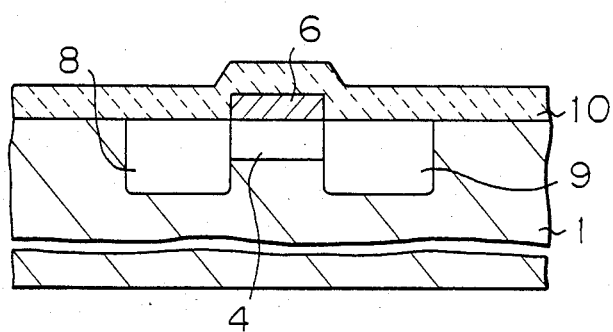

In FIG. 5, the silicon dioxide layer 7 is removed and another silicon dioxide layer 10, approximately 150 nm thick, is deposited over the entire surface as a protective layer for the heat treatment. Preferably, this protective layer may be of AlN. Heat treatment is effected at approximately 800° C. for approximately 10 minutes, resulting in an n$^+$-type source 8 and an n$^+$-type drain 9.

Figure 6:
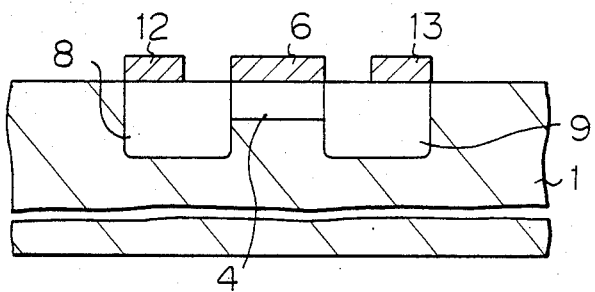

In FIG. 6, the silicon dioxide layer 10 is removed. Gold germanium/gold layers are deposited by vapor evaporation, patterned by a lift-off technique, and alloyed at 450° C. for 2 minutes to form a source electrode 12 and a drain electrode 13, thus completing the FET.

Figure 7:
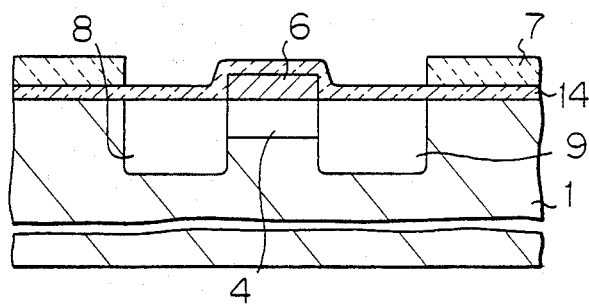

In the above-described example, another AlN layer 14 may be used for protective layer through which ion implantation is performed, as shown in FIG. 7.

The FET's fabricated by the above-described process have transconductances of 270 mS/mm at a threshold voltage of 0.02 V and 300 mS/mm at a threshold voltage of −0.04 V, with a gate length of 1 μm. These transconductances are approximately 1.6 times those of FET's which have a Gaussian carrier concentration distribution. The standard deviation of the threshold voltages of the FET's according to the present invention are 44 meV when measured at about 100 points on the entire surface of a 2 inch-diameter wafer.

Figure 8:
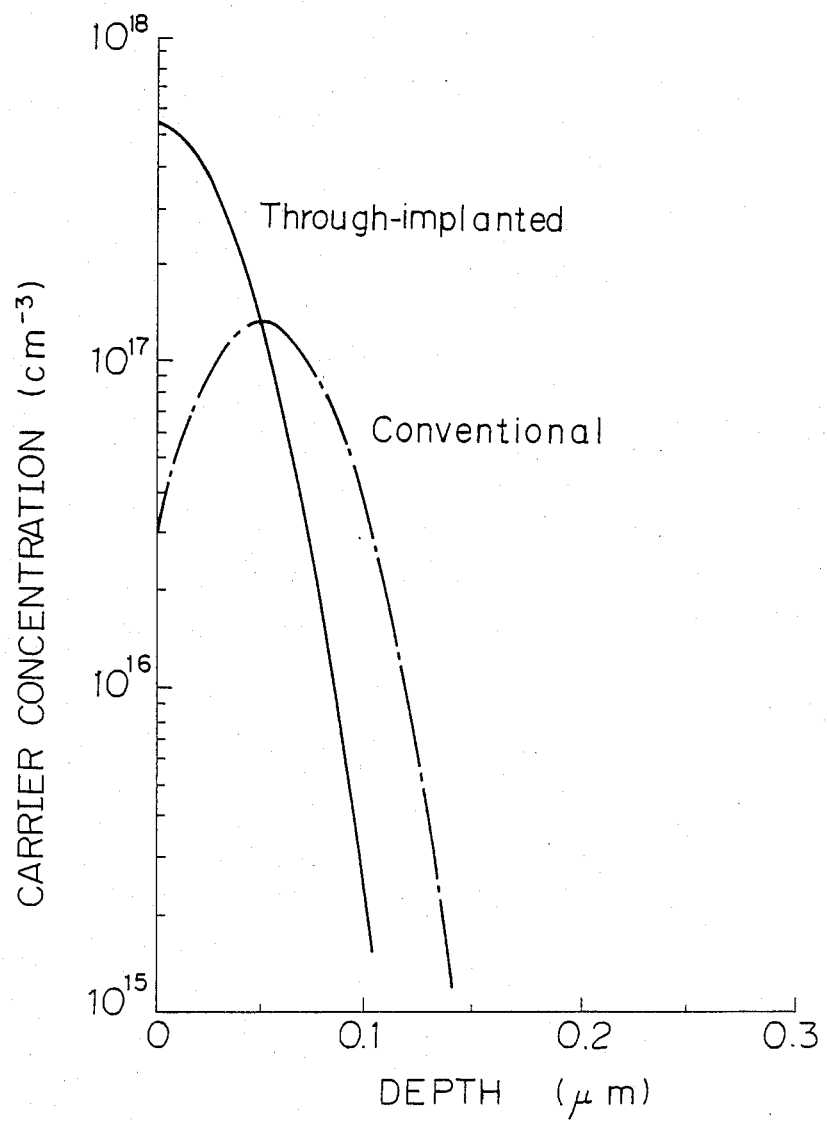
FIG. 8 is a graph of carrier concentration vs. depth.

FIG. 8 is a graph of the silicon ion concentration, i.e., carrier concentration, in the direction of the depth of the channel layer. The solid line in the figure is obtained by the above-described process, and shows the maximum concentration at depth=0, i.e., at the top surface of the channel layer, and monotonously decreases as the depth increases. The dotted line in the figure is obtained by ion implantation without passivating the AlN layer and has the same threshold voltage at that of the FET of the solid line. The difference in the maximum concentrations of these two cases is needed to obtain the same threshold voltage. As seen from the graph, the depth of the channel layer can be thinner in an FET according to the present invention than in a conventional FET. This thinner depth of the channel layer improves the transconductance of an FET.

In the present invention, low dispersion of the threshold voltages of the FET's also results from the through ion-implantation and heat treatment of a GaAs substrate covered by an AlN layer and another insulating layer thereon.

FIG. 9 is a graph of the standard deviation of the threshold voltage in relation to the threshold voltage determined on the basis of long gate FET's fabricated by a process according to the present invention and by a conventional process. The solid line represents an FET according to the present invention, and the dotted line represents an FET obtained by a conventional process. The graph in FIG. 9 clearly shows that the standard deviation of the threshold voltage in an FET according to the present invention is approximately one-third to one-half that of conventional FET's. For example, a threshold voltage of 0.5 V is obtained with the standard deviation of the threshold voltage of 16 mV. This is a result of using the process comprising the steps of forming an AlN layer on a GaAs substrate, selectively ion implanting to form a channel layer, depositing another insulating layer on the AlN layer, and heat treating for activation. This allows the fabrication of LSI's to have a higher degree of integration i.e., 64k-bit or above. In this regard, it should be noted that although an AlN layer was used as the other insulating layer in the before-described example, it has been confirmed that another insulating layer such as $SiO_2$ or $Si_3N_4$ may produce the same effect.

An FET according to the present invention preferably has a maximum concentration of silicon ions at the top surface of the channel layer from $1 \times 10^{17}$ cm$^{-3}$ to $4 \times 10^{18}$ cm$^{-3}$. In the fabrication of an FET according to the present invention, ion implantation of silicon through an AlN layer 20 to 100 nm thick, preferably 55 nm thick, may be performed at 20 to 100 keV, preferably 59 keV, and having a dosage of $1 \times 10^{12}$ to $4 \times 10^{13}$ cm$^{-2}$. The heat treatment for activating the silicon ions may be effected at 700°–1000° C., preferably 850° C., for 1 to 300 minutes, preferably 20 minutes.

We claim:

1. A process for fabricating an FET including a source and a drain formed in a gallium arsenide substrate having a top surface and a bottom surface, and a control gate formed on the top surface of the gallium arsenide substrate, comprising the steps of:
   (a) forming a first aluminum nitride layer on the top surface of the gallium arsenide substrate;
   (b) ion implanting through the first aluminum nitride insulating layer into an area in the gallium arsenide substrate adjacent to the top surface of the gallium arsenide substrate;
   (c) forming a second aluminum nitride layer on the first aluminum nitride layer; and
   (d) heat treating the ion-implanted gallium arsenide substrate to form a channel layer adjacent to the top surface of the gallium arsenide substrate by activating the ions employing the first and second aluminum nitride insulating layers as protective layers for said heat treating step.

2. A process according to claim 1, wherein said steps (a)–(c) are performed such that the concentration of ions in the channel layer has a maximum value at the surface adjacent to the top surface of the gallium arsenide substrate and monotonously decreases in a direction from the top surface toward the bottom surface of the gallium arsenide substrate.

3. A process according to claim 2, wherein said step (b) comprises ion implanting with silicon ions.

4. A process according to claim 3, wherein said step (a) comprises forming the first aluminum nitride insulating layer to a thickness of 50 to 200 nm;
   wherein said step (b) comprises implanting the silicon ions at an energy of 20 to 100 keV and having a maximum concentration of $1 \times 10^{17}$ to $4 \times 10^{18}$ cm$^{-3}$; and
   wherein sid step (d) comprises heat treating the gallium arsenide substrate at a temperature of 700° C. to 1000° C. for 1 to 300 minutes.

5. A process according to claim 4, wherein said step (a) comprises forming the first aluminum nitride insulating layer to a thickness of substantially 55 nm;
   wherein said step (b) comprises ion implanting the silicon ions at an energy of approximately 59 keV and a dosage of approximately $4 \times 10^{12}$ cm$^{-2}$; and
   wherein said step (d) comprises heat treating the gallium arsenide semiconductor substrate at a temperature of approximately 850° C. for approximately 20 minutes.

6. A process according to claim 4, wherein said step (a) comprises forming the aluminum nitride insulating layer to a depth of approximately 30 nm;
   wherein said step (b) comprises ion implanting the silicon ions at an energy of approximately 32 keV and a dosage of approximately $6 \times 10^{12}$ cm$^{-2}$; and
   wherein said step (d) comprises heat treating the gallium arsenide substrate at a temperature of approximately 850° C. for approximately 20 minutes.

7. A method for producing an FET, comprising the steps of:
   (a) forming a first aluminum nitride insulating layer on a gallium arsenide substrate having a top surface and a bottom surface;
   (b) forming a channel layer in the top surface of the gallium arsenide substrate by ion implanting through the first aluminum nitride insulating layer and then carrying out a heat treatment, the concentration of ions in the channel layer being such that the ion concentration is at a maximum at the surface of the channel layer and monotonously decreases toward the bottom surface of the gallium arsenide substrate;
   (c) forming a second aluminum nitride insulating layer on the first aluminum nitride insulating layer;
   (d) forming a control gate over the channel layer; and
   (e) forming source and drain regions in the gallium arsenide substrate adjacent to the channel layer.

8. A method according to claim 7, wherein said step (a) comprises forming the first aluminum nitride insulating layer to a thickness of 50 to 200 nm, wherein said step (b) comprises forming the channel layer by implanting silicon ions into the gallium arsenide substrate at an energy of 20 to 100 keV and having a maximum concentration of $1 \times 10^{17}$ to $1 \times 10^{18}$ cm$^{-3}$, and then heat treating the gallium arsenide substrate at a temperature of 700° C. to 1000° C. for 1 to 300 minutes.

9. A method according to claim 8, wherein said step (a) further comprises forming the aluminum nitride insulating layer to a thickness of substantially 55 nm, and wherein said step (b) further comprises forming the channel layer by ion implanting the silicon ions at an energy of substantially 59 keV and a dosage of substantially $4 \times 10^{12}$ cm$^{-2}$, and then heat treating the gallium arsenide substrate at substantially 850° C. for substantially 20 minutes.

* * * * *